(12) United States Patent
Kim et al.

(10) Patent No.: US 7,572,653 B2
(45) Date of Patent: Aug. 11, 2009

(54) METHOD OF FABRICATING LIGHT EMITTING DIODE

(75) Inventors: Jong Hwan Kim, Ansan-si (KR); Yeo Jin Yoon, Ansan-si (KR); Jae Ho Lee, Yongin-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 74 days.

(21) Appl. No.: 11/750,955

(22) Filed: May 18, 2007

(65) Prior Publication Data
US 2007/0269913 A1    Nov. 22, 2007

(30) Foreign Application Priority Data
May 18, 2006    (KR) .................. 10-2006-0044735

(51) Int. Cl.
*H01L 21/00* (2006.01)
*H01L 21/311* (2006.01)

(52) U.S. Cl. .................. 438/22; 438/701; 257/95; 257/E51.014

(58) Field of Classification Search .......... 438/22, 438/701; 257/95, E51.014
See application file for complete search history.

(56) References Cited

U.S. PATENT DOCUMENTS

| 6,498,087 | B2 * | 12/2002 | French et al. ............... 438/609 |
| 6,808,957 | B1 * | 10/2004 | Ho et al. ..................... 438/57 |
| 6,838,741 | B2 * | 1/2005  | Sandvik et al. ............. 257/438 |
| 2006/0169997 | A1 * | 8/2006 | Suzuki et al. ............... 257/95 |

\* cited by examiner

*Primary Examiner*—David S Blum
(74) *Attorney, Agent, or Firm*—H.C. Park & Associates, PLC

(57) ABSTRACT

Disclosed herein is a method of fabricating a light emitting diode. The method comprises preparing a substrate, forming a lower semiconductor layer, an active layer and an upper semiconductor layer on the substrate, forming a photoresist pattern over the upper semiconductor layer such that a sidewall of the photoresist pattern is inclined to an upper surface of the substrate, and sequentially etching the upper semiconductor layer, active layer and lower semiconductor layer using the photoresist pattern as an etching mask. With this structure, since the light emitting diode permits light generated in the active layer to be easily emitted to an outside through the sidewalls of the semiconductor layers, it has improved light emitting efficiency.

20 Claims, 4 Drawing Sheets

METHOD OF FABRICATING LIGHT EMITTING DIODE

CROSS REFERENCE TO RELATED APPLICATIONS

This application claims priority from Korean Patent Application No. 10-2006-0044735 filed on May 18, 2006, all of which are herein incorporated by reference in their entirety.

BACKGROUND OF THE INVENTION

1. Field of the Invention

The present invention relates to a method of fabricating a light emitting diode, and more particularly to a method of fabricating a light emitting diode that has an inclined sidewall to improve light emitting efficiency.

2. Description of the Related Art

Light emitting diodes (LEDs) are photoelectric transformation elements with a structure in which a P-type semiconductor is joined to an N-type semiconductor to emit light via recombination of holes and electrons in a junction between the P-type semiconductor and the N-type semiconductor by application of forward bias. Since colors of light emitted from the LED depend on the band-gap energy of the semiconductors, the LED for emitting light of an intended color can be fabricated through proper selection of semiconductor materials.

The LEDs enable exhibition of various colors by emitting light of various colors and are widely applied to display devices and backlights for various electronics, instrument panels, electronic display boards, etc.

Additionally, since the LEDs have lower power consumption and longer lifetime compared with conventional lighting instruments, such as incandescent lamps or fluorescent lamps, they are replacing the conventional light instruments and increasing in use for general lighting applications. However, for the LEDs to be used for the general lighting applications, it is very important to improve light emitting efficiency of the LEDs, and various techniques have been developed for this purpose.

FIG. 1 is a schematic cross-sectional view of a conventional light emitting diode.

Referring to FIG. 1, the conventional LED 1 comprises semiconductor layers 16 formed on a substrate 11. The semiconductor layers 16 comprise an n-type semiconductor layer 15, an active layer 17, and a p-type semiconductor layer 19 sequentially stacked on the substrate 11. Additionally, the LED 1 generally comprises a buffer layer 13 formed between the substrate 111 and the N-type semiconductor layer 15 to relieve lattice mismatch therebetween, and a metal layer 21 on the p-type semiconductor layer 19.

The metal layer 21, p-type semiconductor layer 19, and active layer 17 formed on the N-type semiconductor layer 15 are sequentially etched to expose an upper surface of the N-type semiconductor layer 15, followed by respectively forming pads 23 and 25 on the upper metal layer 21 of the p-type semiconductor layer 19 and on the exposed N-type semiconductor layer 15 to form a metal wire on the LED 1.

With such a structure, the conventional LED has sidewalls vertical to an upper surface of the substrate and permits light emitted upwardly from the active layer 17 to be emitted through the top surface of the LED via the metal layer 21.

Here, when light emitted from the active layer 17 toward the sidewalls of the semiconductor layers reaches the sidewalls vertically formed as mentioned above, it is subjected to total reflection into the semiconductor layers with an increase in incident angle of the light instead of being easily emitted to air due to a difference in refractive index between the semiconductor layers and air, thereby decreasing the light emitting efficiency.

SUMMARY OF THE INVENTION

The present invention is conceived to solve the problems of the conventional techniques as described above, and an object of the present invention is to provide a method of fabricating a light emitting diode that has a good lateral light emitting efficiency.

In accordance with one aspect of the present invention, the above and other objects can be accomplished by the provision of a method of fabricating a light emitting diode, comprising: preparing a substrate; forming a lower semiconductor layer, an active layer, and an upper semiconductor layer on the substrate; forming a photoresist pattern over the upper semiconductor layer such that a sidewall of the photoresist pattern is inclined to an upper surface of the substrate; and sequentially etching the upper semiconductor layer, active layer and lower semiconductor layer using the photoresist pattern as an etching mask.

The step of forming the photoresist pattern may comprise forming the photoresist pattern for defining a light emitting region and performing a reflow process to the photoresist pattern such that the sidewall of the photoresist pattern is inclined to the upper surface of the substrate.

Preferably, the reflow process of the photoresist pattern is performed such that the sidewall of the photoresist pattern has an inclined angle in the range of 10~80 degrees with respect to the upper surface of the substrate.

Therefore, the light emitting diode manufactured by the method of the invention permits light emitted from the active layer to be easily emitted to air through the sidewalls of the semiconductor layers, thereby achieving a higher light emitting efficiency.

The method of the invention may further comprise forming an etching stop pattern for defining the light emitting region on a portion of the upper semiconductor layer before forming the photoresist pattern.

Preferably, the etching stop pattern is formed of metal.

BRIEF DESCRIPTION OF THE DRAWINGS

The above and other objects, features and advantages of the present invention will become apparent from the following description of exemplary embodiments given in conjunction with the accompanying drawings, in which.

DETAILED DESCRIPTION OF THE INVENTION

Figure 1:
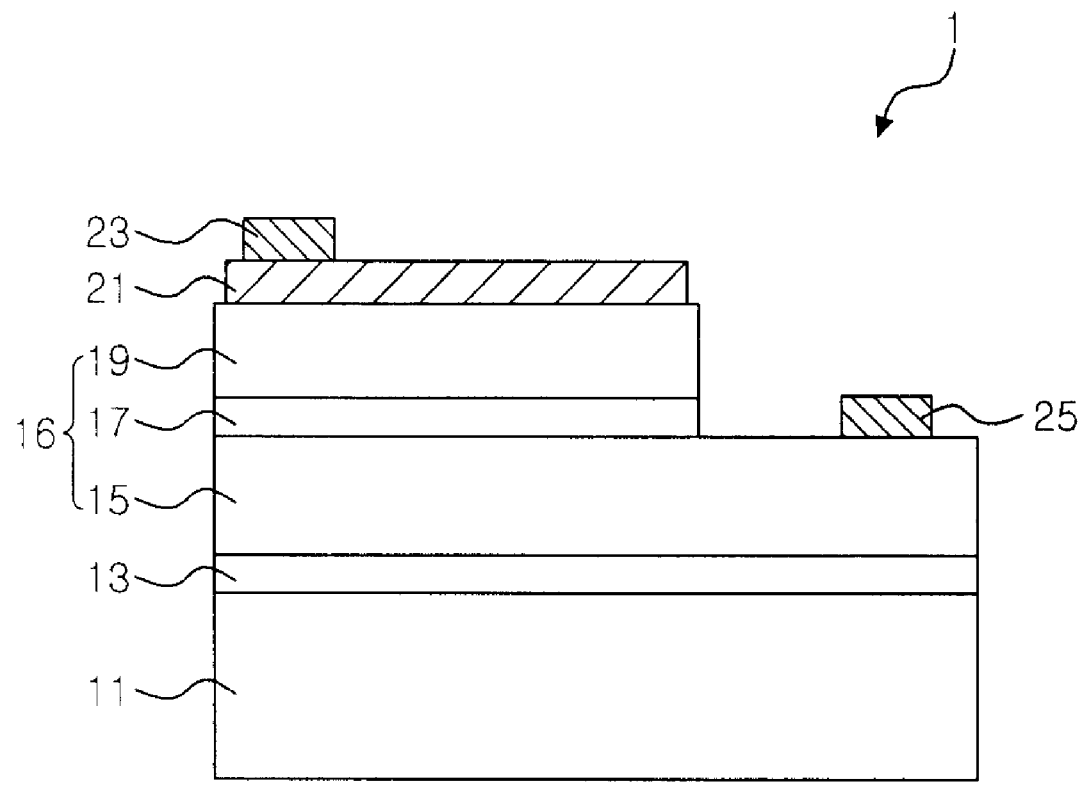
FIG. 1 is a schematic cross-sectional view of a conventional light emitting diode.

Exemplary embodiments of the present invention are described in detail with reference to the accompanying drawings hereinafter. The following embodiments are to be interpreted merely as an illustrative basis for teaching one skilled in the art to sufficiently understand the spirit of the invention. Therefore, it is to be understood that the present invention is not limited to the embodiments disclosed herein and can be embodied in various different forms. Further, in the drawings, widths, lengths, thicknesses and the like of components can be expressed in exaggerated manners for descriptive convenience. Like elements are denoted by like reference numerals throughout the specification and drawings.

Figure 2:
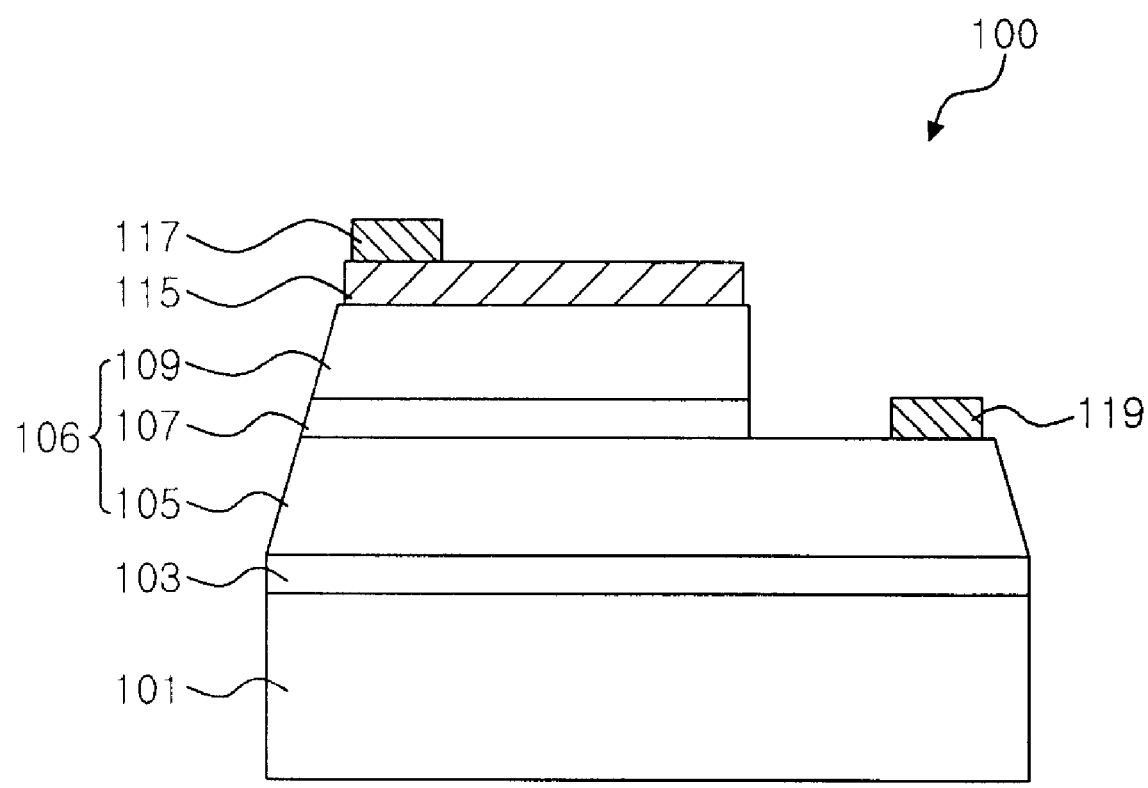
FIG. 2 is a cross-sectional view of a light emitting diode according to an exemplary embodiment of the present invention.

FIG. 2 is a cross-sectional view of a light emitting diode according to an exemplary embodiment of the present invention.

Referring to FIG. 2, the light emitting diode comprises semiconductor layers 106 on a substrate 101. The substrate 101 may be a substrate formed of an insulating material, or a conductive material, for example, sapphire or silicon carbide (SiC). The substrate 101 may be a substrate of which upper and/or lower surfaces are patterned.

The semiconductor layers 106 comprise a lower semiconductor layer 105, an upper semiconductor layer 109 located on a region of the lower semiconductor layer 105, and an active layer 107 interposed between the upper and lower semiconductor layers. Here, the upper and lower semiconductor layers are n-type and p-type semiconductor layers, or the p-type and n-type semiconductor layers, respectively.

The lower semiconductor layer 105, active layer 107 and upper semiconductor layer 109 may be formed of gallium nitride based materials, i.e. (B, Al, In, Ga)N. The active layer 107 is formed of a material, of which composition is determined to generate light of a desired wavelength, such as an ultraviolet beam and blue light. The lower and upper semiconductor layers 105 and 109 are formed of materials that have greater band-gap energies than that of the active layer 107.

As shown in the drawings, the lower semiconductor layer 105 and/or the upper semiconductor layer 109 may be formed in a single layer or in a multi-layer structure. Additionally, the active layer 107 may have a single quantum well structure or a multi-quantum well structure.

Meanwhile, a buffer layer 103 may be interposed between the semiconductor layers 106 and the substrate 101. The buffer layer 103 serves to relieve lattice mismatch between the substrate 101 and the lower semiconductor layer 105 formed on the substrate 101.

Sidewalls of the semiconductor layers 106 are formed obliquely with respect to an upper surface of the substrate 101 and have a width gradually reduced upwardly. The inclination of the sidewalls improves emission effects of light generated in the active layer 107. In this embodiment, the sidewalls of the lower semiconductor layers 105 of the semiconductor layers 106 may have an inclined angle in the range of 10~80 degrees with respect to the upper surface of the substrate 101.

An electrode pad 119 may be formed on the lower semiconductor layer 105. The electrode pad 119 makes an ohmic contact with the lower semiconductor layer 105. And, a wire (not shown) is bonded to the electrode pad 119 to be electrically connected to the lower semiconductor layer 105.

Further, a transparent electrode layer 115 may be formed on the upper semiconductor layer 109. The transparent electrode layer 115 transmits light generated in the active layer 107 and supplies current to the upper semiconductor layer 109 in a distributive manner. An electrode pad 117 may be further formed on the transparent electrode layer 115, and a wire (not shown) is bonded to the electrode pad 117.

Figure 3:
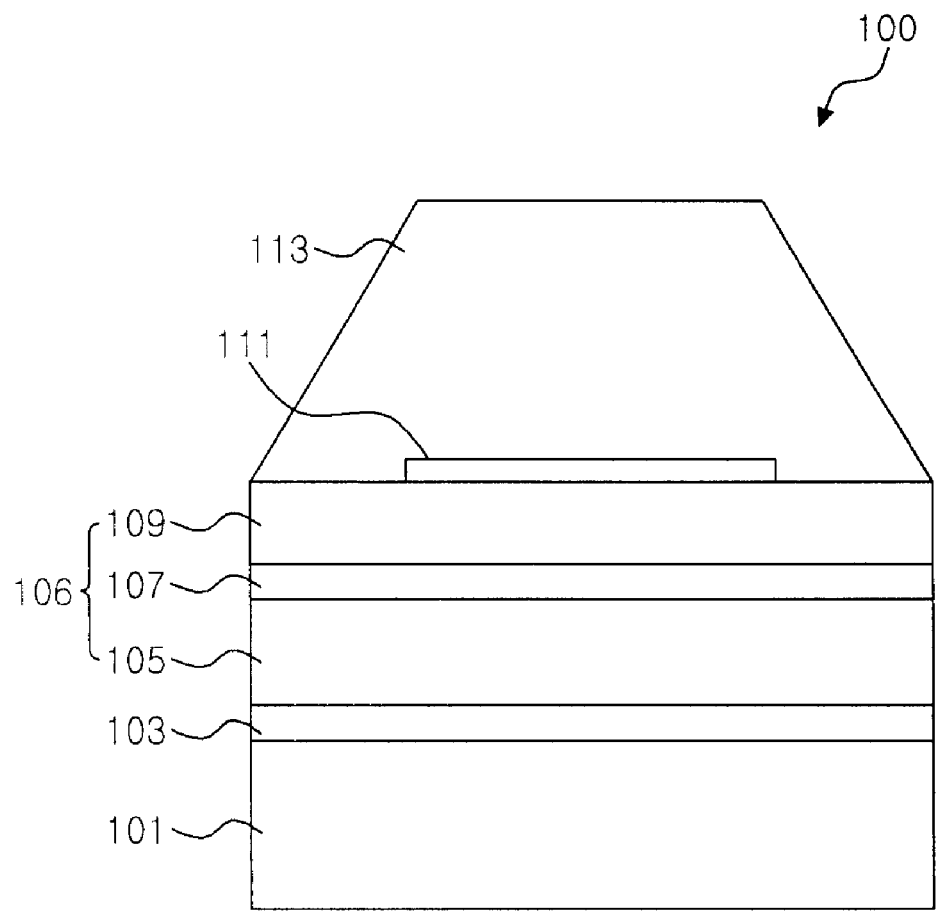
FIGS. 3 to 5 are views illustrating a method of fabricating a light emitting diode according to an exemplary embodiment of the present invention.
Figure 4:
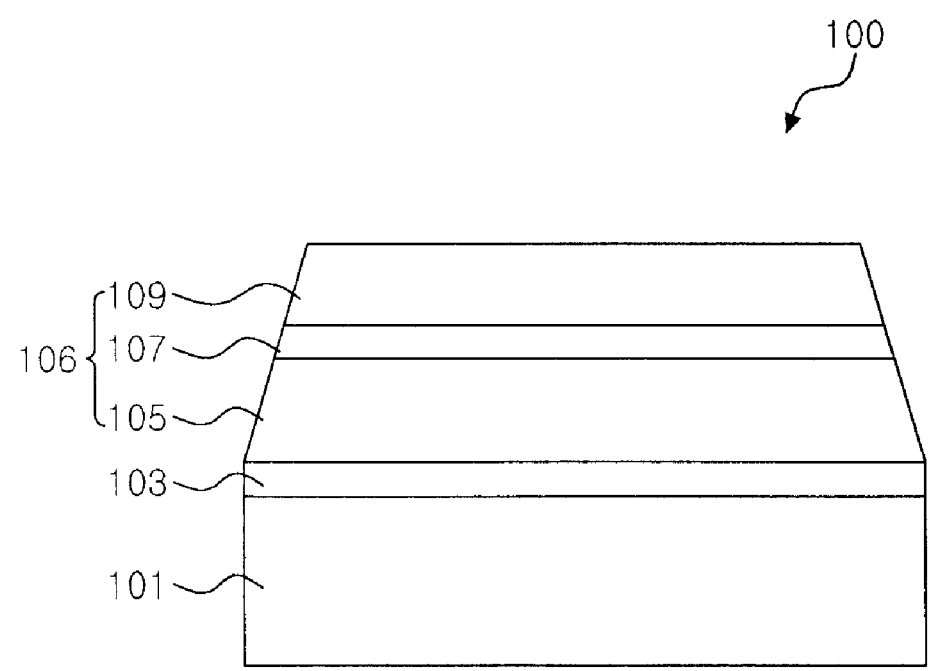
Figure 5:
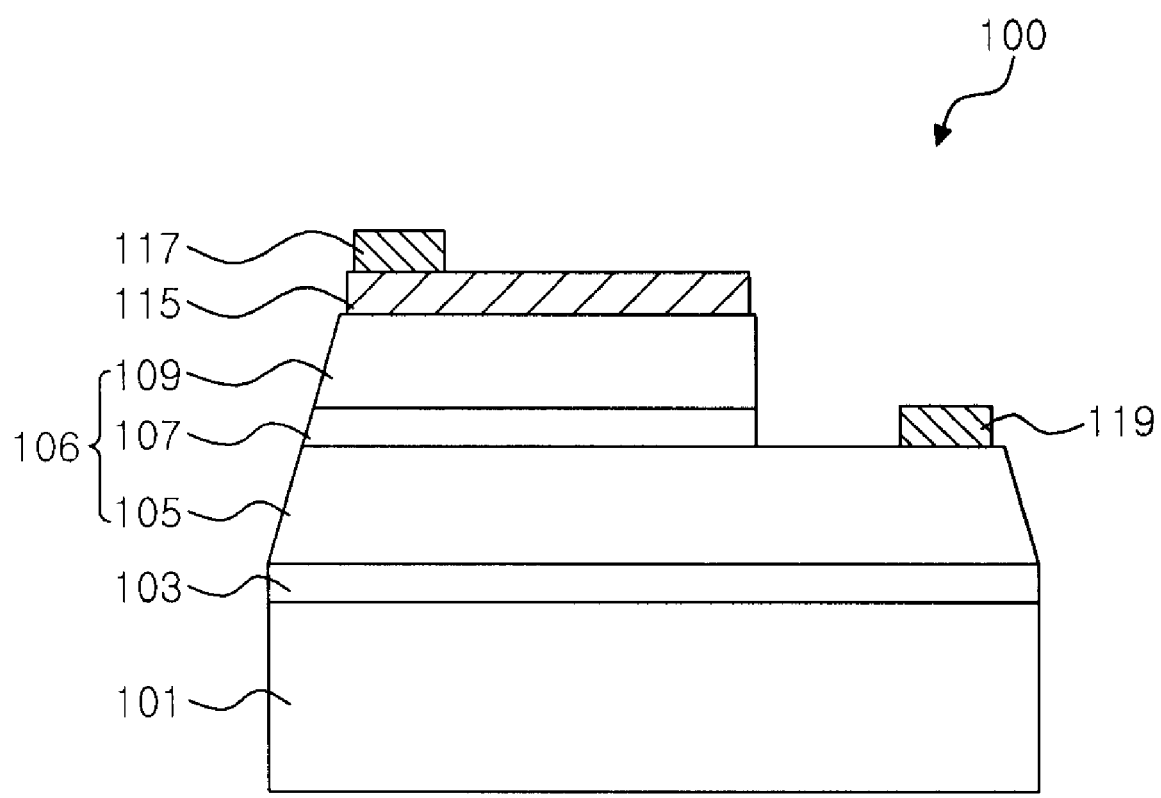
Figure 6:
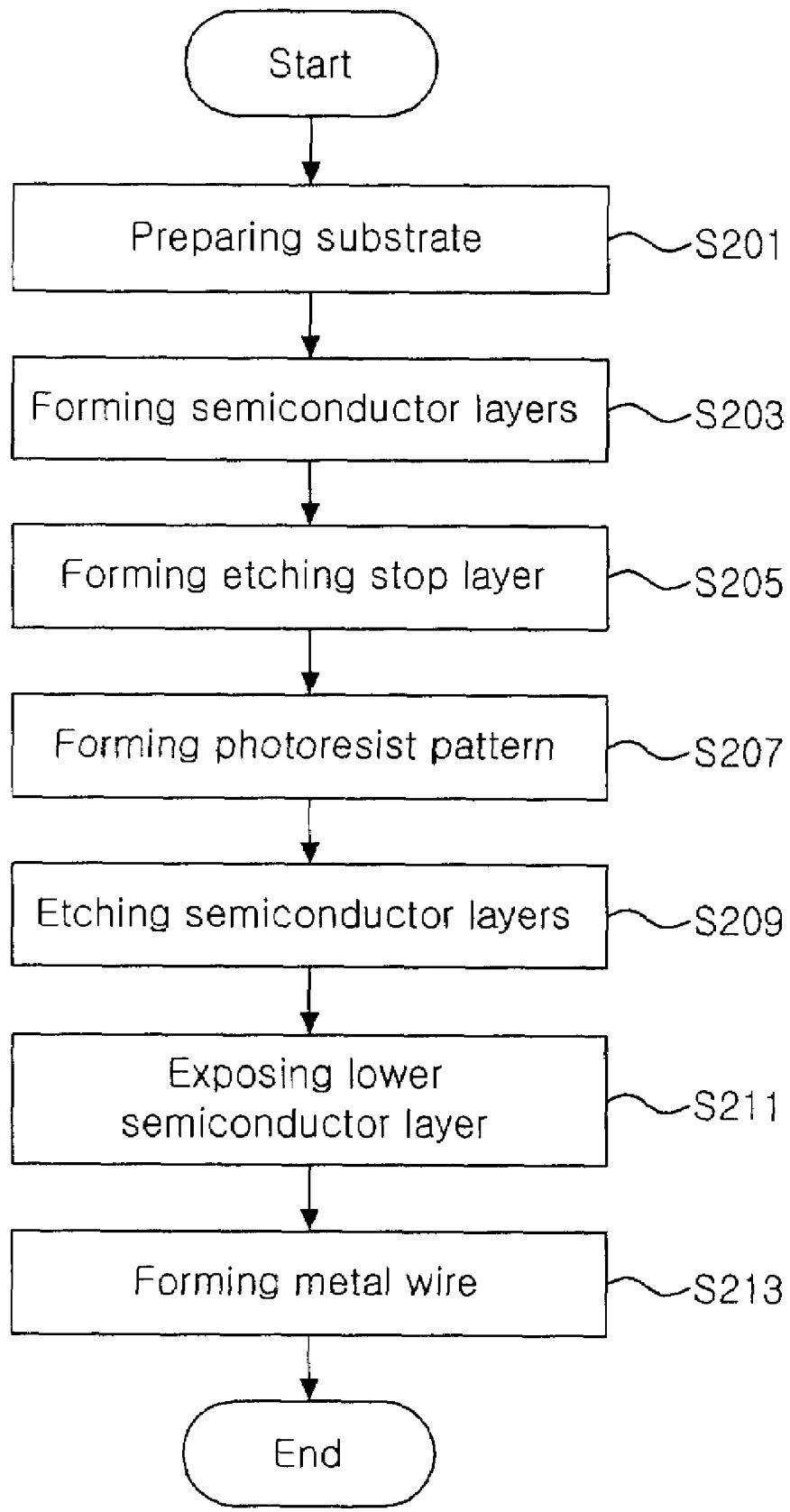
FIG. 6 is a flow chart illustrating the method of fabricating the light emitting diode according to the exemplary embodiment of the present invention.

FIGS. 3 to 5 are views illustrating a method of fabricating a light emitting diode according to an exemplary embodiment of the present invention, and FIG. 6 is a flow chart illustrating the method of fabricating the light emitting diode according to the exemplary embodiment of the present invention.

Referring to FIG. 6, a substrate 101 is prepared (S201). The substrate 101 may be, for example, a sapphire substrate or a silicon carbide substrate.

Then, semiconductor layers are formed on the substrate 101 (S203). Referring to FIG. 3, a lower semiconductor layer 105, an active layer 107, and an upper semiconductor layer 109 are formed on the substrate 101. Additionally, a buffer layer 103 may be formed on the substrate 101 before the lower semiconductor layer 105 is formed thereon.

The substrate 101 may be a substrate formed of, but is not limited to, sapphire ($Al_2O_3$), silicon carbide (SiC), zinc oxide (ZnO), silicon (Si), gallium arsenide (GaAs), gallium phosphate (GaP), lithium-alumina ($LiAl_2O_3$), boron nitride (BN), aluminum nitride (AlN), or gallium nitride (GaN), which can be selected in various manners according to a material of a semiconductor layer to be formed on the substrate 101.

The buffer layer 103 is formed to relieve lattice mismatch between the substrate 101 and the lower semiconductor layer 105 to be formed on the substrate 101, and may be formed of, for example, GaN or AlN. When the substrate is a conductive substrate, it is desirable that the buffer layer 103 be an insulating layer or a semi-insulating layer, which can be formed of AlN or a semi-insulating GaN.

The lower semiconductor layer 105, active layer 107 and upper semiconductor layer 109 may be formed of gallium nitride based materials, i.e. (B, Al, In, Ga)N. The lower and upper semiconductor layers 105 and 109, and the active layer 107 may be intermittently or consecutively grown using metal organic chemical vapor deposition (MOCVD), molecular beam epitaxy or hydride vapor phase epitaxy (HVPE), etc.

Here, the lower and upper semiconductor layers may be n-type and p-type semiconductor layers, or vice versa. In the GaN-based semiconductor layers, the n-type semiconductor layer can be formed by doping impurities such as silicon (Si), and the p-type semiconductor layer can be formed by doping impurities such as magnesium (Mg).

Then, a photoresist pattern 113 is formed over the upper semiconductor layer 109 to define a light emitting region (S207). The photoresist pattern 113 is formed to cover the upper surface of the light emitting region. Here, the photoresist pattern 113 is subjected to a reflow process such that a sidewall of the photoresist pattern 113 is inclined with respect to an upper surface of the substrate 101. Therefore, the photoresist pattern 113 may be formed such that the side wall thereof has an inclined angle in the range of 10~80 degrees with respect to the upper surface of the substrate 101.

Meanwhile, an etching stop pattern 111 may be formed to define the light emitting region before forming the photoresist pattern 113 (S205). Preferably, the etching stop pattern 111 is formed of a material, for example, a metallic material, that has low etching selection properties to an etchant used for etching the semiconductor layers 105, 107 and 109.

Then, the upper semiconductor layer 109, active layer 107 and lower semiconductor layer 105 are sequentially etched using the photoresist pattern 113 (S209). Therefore, the shape of the photoresist pattern 113 is transferred to the semiconductor layers 109, 107 and 105 to form semiconductor layers of which sidewalls are inclined, as shown in FIG. 4. The buffer layer 103 can be exposed by such an etching process, and can be removed by over-etching.

Referring to FIG. 5, after removing the photoresist pattern 113 and etching stop pattern 111, the upper semiconductor layer 109 and the active layer 107 are patterned again to expose the etched lower semiconductor layer 105 (S211). At this time, the exposed lower semiconductor layer 105 can be partially etched by over-etching. As a result, the semiconductor layers 106 are formed on the substrate 101 to have inclined sidewalls. The semiconductor layers 106 comprise the lower semiconductor layer 105, the upper semiconductor layer 109 located on a region of the lower semiconductor layer 105, and the active layer 107 interposed between the lower and upper semiconductor layers 105 and 109, in which other regions of the lower semiconductor layer 105 are exposed. Furthermore, most of the sidewalls of the semiconductor layers 106 are inclined to the upper surface of the substrate 101. On the other hand, although the sidewall of the upper semiconductor layer 109 adjacent the other regions of the lower semiconductor layer 105 is vertically formed in FIG. 5, it can also be formed obliquely.

Referring to FIG. 5, a transparent electrode layer 115 may be formed on the upper semiconductor layer 109 of the semiconductor layers 106. The transparent electrode layer 115 is formed of an indium tin oxide (ITO) film or a transparent metal such as Ni/Au. Further, an electrode pad 119 may be formed on the lower semiconductor layer 105. The electrode pad 119 makes an ohmic contact with the lower semiconductor layer 105.

The transparent electrode layer 115 may be formed on the upper semiconductor layer 109 before forming the photoresist pattern 113. At this time, the transparent electrode layer 115 is patterned along with the upper semiconductor layer 109.

An electrode pad 117 may be further formed on the transparent electrode layer 115, and a wire may be bonded to the electrode pad 117.

As apparent from the above description, the light emitting diode according to the embodiments of the invention has sidewalls of semiconductor layers formed obliquely on a substrate to allow light generated in an active layer to be more easily emitted to air through sidewalls of the semiconductor layers, which leads to improved light emitting efficiency.

Although the present invention has been described with reference to the embodiments and the accompanying drawings, it is not limited to the embodiments and the drawings. It should be understood that various modifications and changes can be made by those skilled in the art without departing from the spirit and scope of the present invention defined by the accompanying claims.

What is claimed is:

1. A method of fabricating a light emitting diode, comprising:
preparing a substrate;
forming a lower semiconductor layer, an active layer, and an upper semiconductor layer on the substrate;
forming an etching stop pattern on a portion of the semiconductor layer;
forming a photoresist pattern over the upper semiconductor layer and the etching stop pattern such that a sidewall of the photoresist pattern is inclined to an upper surface of the substrate; and
sequentially etching the upper semiconductor layer, active layer and lower semiconductor layer using the photoresist pattern as an etching mask; and
removing the photoresist pattern and the etching stop pattern.

2. The method according to claim 1, wherein the step of forming the photoresist pattern comprises forming the photoresist pattern for defining a light emitting region and performing a reflow process to the photoresist pattern such that the sidewall of the photoresist pattern is inclined to the upper surface of the substrate.

3. The method according to claim 2, wherein the reflow process of the photoresist pattern is performed such that the sidewall of the photoresist pattern has an inclined angle in the range of 10~80 degrees with respect to the upper surface of the substrate.

4. The method according to claim 1, wherein the etching stop pattern is formed of metal.

5. The method according to claim 1, further comprising:
forming a first electrode pad on the lower semiconductor layer; and
forming a second electrode pad on the upper semiconductor layer,
wherein the first electrode pad and the second electrode pad are disposed on the substrate.

6. The method according to claim 1, further comprising after removing the photoresist pattern and the etching stop pattern, etching the upper semiconductor layer and the active layer to expose a portion of the lower semiconductor layer.

7. The method according to claim 6, wherein both sidewalls of the lower semiconductor layer are inclined to the upper surface of the substrate, and only sidewall of the active layer and only one sidewall of the upper semiconductor layer are inclined to the upper surface of the substrate.

8. The method according to claim 6, wherein both sidewalls of the lower semiconductor layer, the active layer, and the upper semiconductor layer are inclined to the upper surface of the substrate.

9. The method according to claim 1, wherein the width of the lower semiconductor layer, the active layer, and the upper semiconductor layer decrease in a first direction, and light is emitted from the light emitting device in the first direction.

10. The method according to claim 1, further comprising forming a buffer layer on substrate, wherein the lower semiconductor layer, the active layer, and the upper semiconductor layer are formed on the buffer layer.

11. A method of fabricating a light emitting diode, comprising:
preparing a substrate;
forming a lower semiconductor layer, an active layer, and an upper semiconductor layer on the substrate;
forming a photoresist pattern over the upper semiconductor layer such that a sidewall of the photoresist pattern is inclined to an upper surface of the substrate;
first etching the upper semiconductor layer, active layer and lower semiconductor layer using the photoresist pattern as an etching mask;
removing the photoresist pattern; and
second etching the upper semiconductor layer and the active layer to expose a portion of the lower semiconductor layer after removing the photoresist pattern.

12. The method according to claim 11, wherein the step of forming the photoresist pattern comprises forming the photoresist pattern for defining a light emitting region and performing a reflow process to the photoresist pattern such that the sidewall of the photoresist pattern is inclined to the upper surface of the substrate.

13. The method according to claim 12, wherein the reflow process of the photoresist pattern is performed such that the sidewall of the photoresist pattern has an inclined angle in the range of 10~80 degrees with respect to the upper surface of the substrate.

14. The method according to claim 11, further comprising:
forming an etching stop pattern on a portion of the upper semiconductor layer, the photoresist pattern being formed over the upper semiconductor layer and the etching stop pattern; and removing the etching stop pattern after the first etching but before the second etching.

15. The method according to claim 14, wherein the etching stop pattern is formed of metal.

16. The method according to claim 11, further comprising:
forming a first electrode pad on the upper semiconductor layer; and
forming a second electrode pad on the exposed portion of the lower semiconductor layer,
wherein the first electrode pad and the second electrode pad are disposed on the substrate.

17. The method according to claim 11, wherein both sidewalls of the lower semiconductor layer are inclined to the upper surface of the substrate, and only sidewall of the active layer and only one sidewall of the upper semiconductor layer are inclined to the upper surface of the substrate.

18. The method according to claim 11, wherein both sidewalls of the lower semiconductor layer, the active layer, and the upper semiconductor layer are inclined to the upper surface of the substrate.

19. The method according to claim 11, wherein the width of the lower semiconductor layer, the active layer, and the upper semiconductor layer decrease in a first direction, and light is emitted from the light emitting device in the first direction.

20. The method according to claim 11, further comprising forming a buffer layer on substrate, wherein the lower semiconductor layer, the active layer, and the upper semiconductor layer are formed on the buffer layer.

* * * * *